United States Patent [19]

Rao

[11] Patent Number: 4,642,798
[45] Date of Patent: Feb. 10, 1987

[54] CMOS E²PROM DECODING CIRCUIT

[75] Inventor: Kameswara K. Rao, San Jose, Calif.

[73] Assignee: Intel Corporation, Santa Clara, Calif.

[21] Appl. No.: 782,429

[22] Filed: Oct. 1, 1985

[51] Int. Cl.⁴ .................... G11C 8/00; H03K 19/096
[52] U.S. Cl. .................................. 365/230; 307/449; 307/475; 365/185
[58] Field of Search ............... 307/449, 463, 469, 475; 365/185, 230

[56] References Cited

U.S. PATENT DOCUMENTS

| | | | |
|---|---|---|---|
| 4,130,890 | 12/1978 | Adam | 365/230 X |
| 4,200,917 | 4/1980 | Moench | 307/449 X |
| 4,264,828 | 4/1981 | Perlegos et al. | 307/463 |
| 4,344,005 | 8/1982 | Stewart | 365/230 X |
| 4,374,430 | 2/1983 | Higuchi | 307/449 X |
| 4,387,447 | 6/1983 | Klaas et al. | 365/185 X |
| 4,455,629 | 6/1984 | Suzuki et al. | 365/230 |
| 4,477,739 | 10/1984 | Proebsting et al. | 307/463 X |

OTHER PUBLICATIONS

Müller et al., "An 8192-Bit Electrically Alterable ROM Employing a One-Transistor Cell with Floating Gate", IEEE-JSSC, vol. SC-12, No. 5, pp. 507-514, 10/1977.
Ellis, "Decoded Isolation Device for Decoders", IBM-TDB; vol. 26, No. 12, pp. 6652-6653; 5/1984.

Primary Examiner—Larry N. Anagnos
Attorney, Agent, or Firm—Blakely, Sokoloff, Taylor & Zafman

[57] ABSTRACT

A static decoding circuit which may be utilized with E²PROM arrays. The circuit utilizes predecoded address signals to generate signals to the word lines in read, program, erase and bulk erase modes. The circuit includes a low voltage to high voltage converter, CMOS switches and post decoders which include a p-channel device so that individual row lines may be erased as well as all the row lines. In the read mode, the selected word line goes to VCC and other go to zero. In the programming mode, the selected word line goes to VPP and the selected word line goes to zero and the unselected word lines go to VPP. In the bulk erase mode, all the word lines go to zero.

9 Claims, 3 Drawing Figures

STATE OF THE X-DECODER SIGNALS IN DIFFERENT MODES.

| NAME | READ | PROGRAM | ERASE | BULK ERASE |
|---|---|---|---|---|
| RS4 – RS7 | 1-1, 3-0 | 1-1, 3-0 | 1-1, 3-0 | 1-1, 3-0 |
| RS8 – RS11 | 1-1, 3-0 | 1-1, 3-0 | 1-1, 3-0 | 1-1, 3-0 |
| RS12 – RS15 | 1-1, 3-0 | 1-1, 3-0 | 1-1, 3-0 | 1-1, 3-0 |
| PERSH/$\overline{PERSH}$ | 0/1 | 0/2 | 2-0 | 0-1 |
| VX | 1 | 2 | 2 | 1 |
| RS0 – RS3 | 1-1, 3-0 | 1-2, 3-0 | 1-2, 3-0 | 4-0 |
| $\overline{RS0}$ – $\overline{RS3}$ | 1-0, 3-1 | 1-0, 3-2 | 1-0, 3-2 | 4-1 |
| NDR0-NDR3 | 1-0, 3-1 | 1-0, 3-2 | 4-0, | 4-1 |
| PDR0-PDR3 | 4-1 | 4-2 | 1-2, 3-0 | 4-1 |
| Common Node | 1-1, 63-0 | 1-2, 63,0 | 63-2, 1-0 | 1-1, 63-0 |
| Row0-Row255 | 1-1, 255-0 | 1-2, 255-0 | 1-0, 255-2 | 256-0 |

0 – LOGIC 0 (V0)
1 – LOGIC 1 (Vcc)
2 – HIGH VOLTAGE (VPP)

*Fig. 3*

CMOS E²PROM DECODING CIRCUIT

BACKGROUND OF THE INVENTION

1. Field of the Invention

This invention relates to the field of decoding circuits for electrically erasable, read only memories (E²PROM).

2. Prior Art

In field of MOS integrated circuits memories, memory cell sizes have been greatly reduced. Memory layouts have utilized memory cells arranged along row lines (word lines) in an array with row decoders disposed either along the ends of these lines or bisecting these lines. The decoders enable individual row lines to be accessed and when used in conjunction with column decoders, allow individual cells to be accessed from the memory.

Typically, these decoders have been used in conjunction with read only memory (ROM) or random access memory (RAM). One example of a prior art decoder may be found in U.S. Pat. No. 4,264,828 entitled "MOS Static Decoding Circuit" and assigned to the assigneee of the present invention.

Prior art decoding circuits have the disadvantage of incompatibility with electrically erasable, programmable read only memories (E²PROM). E²PROMs function much like ROMs, in that information may be permanently stored in the cells of the memory array. However, in an E²PROM, the cells can be reprogrammed when subjected to a voltage signal of sufficient strength to change the state of the cell.

It is an object of the present to provide a decoder circuit which can be used with an E²PROM. It is a further object of the present invention to provide a decoder which allows erasing of a single word line as well as the erasing of all the word lines.

SUMMARY OF THE INVENTION

The decoding circuit of the present invention utilizes a 13 bit address which is passed through a predecoding stage comprised of buffers and predecoders. 5 bits of this 13 bit address are used to select columns of the memory array. The remaining address bits are passed through a predecoding stage consisting of buffers and predecoding circuits. The output of the predecoders is input into the decoding circuit of the present invention. This decoding circuit also includes a predecoding stage comprising a 3 input NAND gate. The output of the predecoder is passed through a low voltage to high voltage conversion stage and then to a selection stage for selecting read mode, program mode or erase mode. The output of this stage produces a signal at a node. A plurality of post decoders, each leading to a row in the memory array, are coupled to this node. Each of the post decoders include a CMOS switch. This switch is coupled to the sources of a p-channel and n-channel transistor. The p-channel transistors enable the erasing mode to be implemented by holding unselected rows at the programming voltage. During the erase mode, unselected word lines go to VPP (programming voltage) while the selected word line goes to 0. The circuit of the present invention also permits bulk erasure where all word lines go to 0.

BRIEF DESCRIPTION OF THE DRAWINGS

FIG. 3 is a table showing the states of certain signals during various modes of operation.

DETAILED DESCRIPTION OF THE PRESENT INVENTION

A decoding circuit for use with electrically erasable, programmable read only memories (E²PROM) is described. In the following description, numerous specific details are set forth, such as voltage levels etc., in order to provide a more thorough understanding of the present invention. It will be obvious, however, to one skilled in art, that the present invention may be practiced without these specific details. In other instances, well known circuits have not been described in detail in order not to unnecessarily obscure the present invention.

In the following description, the circuit will be described in regard to a 64K E²PROM. The array includes 256 column lines and 256 row lines. A memory cell is disposed at the intersection of each of the column lines and row lines. Decoders are employed to select column lines. The decoder of the present invention is coupled to four row lines.

Figure 1:
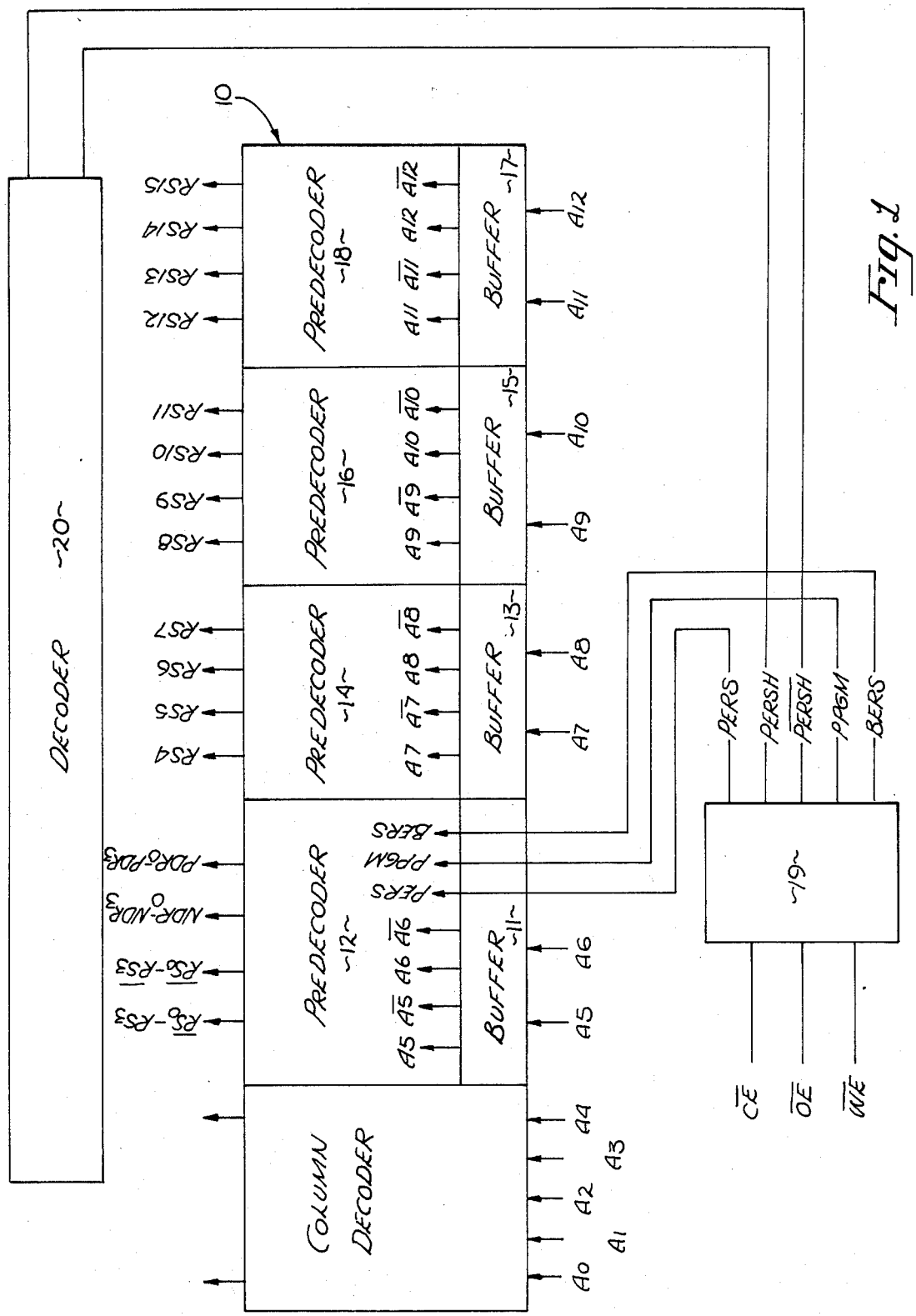
FIG. 1 is a block diagram illustrating the predecoding stage of the present invention.

In the preferred embodiment, the memory is addressed with a 13 bit address as shown in FIG. 1. The address consists of bits A0 through A12. Five bits, A0 through A4, are employed to access 8 column lines. Thus, for each row address an 8 bit word is selected. Address bits A5 and A6 are coupled to buffer 11. Buffer 11 divides signals A5 and A6 into their complement form and couples them to predecoder 12 so that the input of predecoder 12 is A5, $\overline{A5}$, $\overline{A6}$, and A6. Predecoder 12 has 3 additional inputs PERS, PRGM and BERS. These signals are generated by multiplexor 19. The input of multiplexor 19 is $\overline{CE}$ (clock enable signal), $\overline{OE}$ (output enable signal), and $\overline{WE}$ (write enable signal). The outputs of multiplexor 19 are PERS, PERSH, $\overline{PERSH}$, PPGM and BERS. PERS is a signal which controls the erasing of a single word line. PERSH and $\overline{PERSH}$, are both coupled to the decoding circuit 20 of the present invention and control the erase. The PPGM signal is a programming signal and BERS is a bulk erase signal. PPGM and BERS are also coupled to predecoder 12 along with PERS. The output of predecoder 12 is input into the decoding circuit 20 of the present invention. The outputs of predecoder 12 are signals RS0 to RS3, $\overline{RS0}$ to $\overline{RS3}$, NDR0 to NDR3, and PDR0 to PDR3. The RS signals are row select signals which indicate the row which is to be accessed. The NDR signals are coupled to the row lines through a pulldown n-channel transistor. The PDR signals are coupled to a p-channel transistor which permits erasure of row lines.

Address signals A7 and A8 are coupled to buffer 13. Buffer 13 provides the address signals and their complements to predecoder 14. The output of predecoder 14 are row select signals RS4 through RS7.

Address signals A9, A10 and A11, A12 are input into buffers 15 and 17 respectively. These buffers provide the address signals and their complements to predecoder 16 and 18 respectively. The output of predecoder 16 are row select signals RS8 through RS11 while the output of predecoder 18 are row select signals RS12 and RS15.

In the presently preferred embodiment, the entire memory is fabricated employing complementary metal oxide semiconductor (CMOS) technology. The memory cells of the present embodiment are low voltage E²PROM cells such those described in U.S. patent application Ser. No. 667,905 entitled "Low Voltage E²-PROM Memory" filed on Nov. 2, 1984 and assigned to assignee of the present invention.

Figure 2:
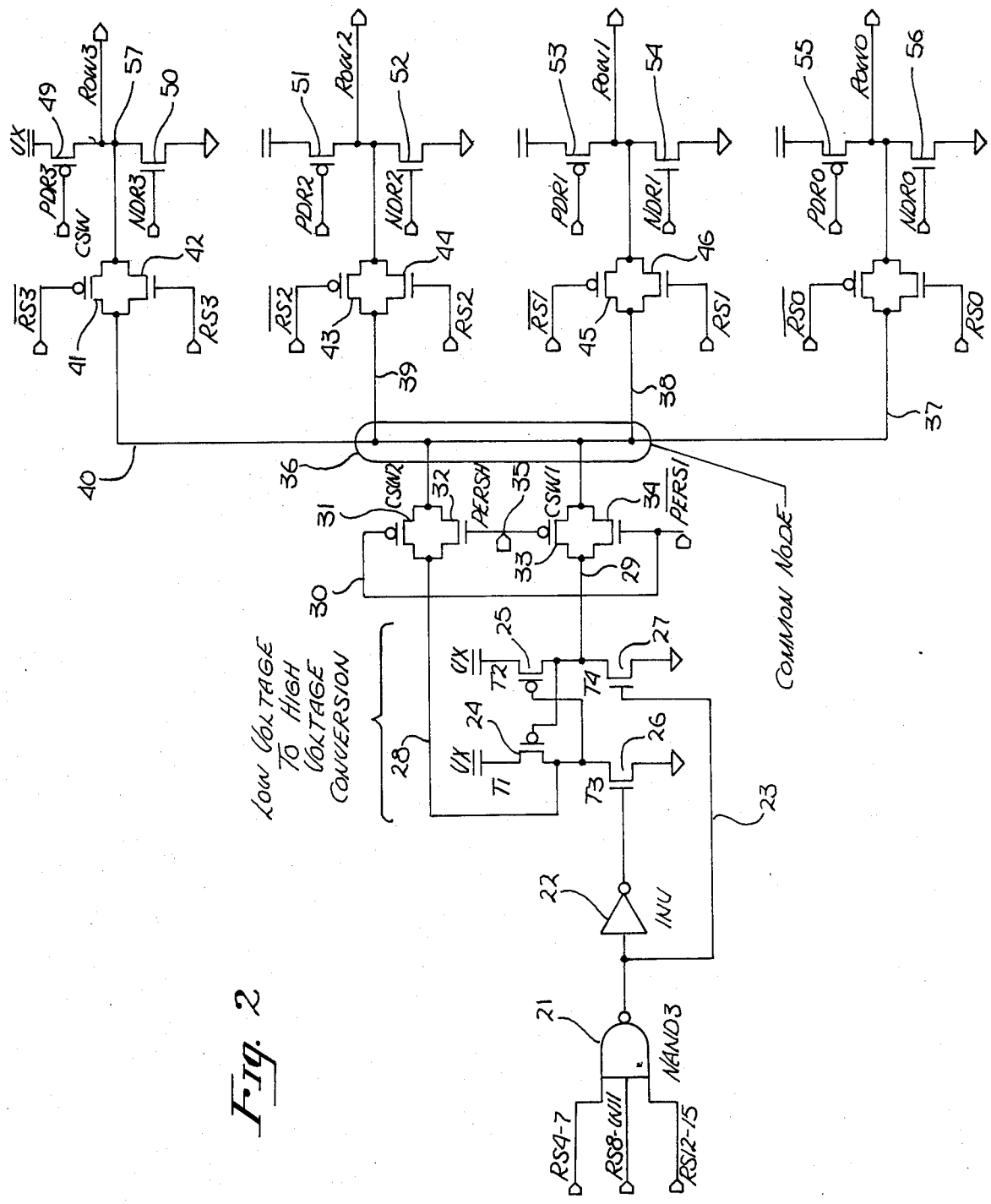
FIG. 2 is an electrical schematic illustrating the decoding circuit of the present invention.

The decoding circuit of the present invention is illustrated in FIG. 2. NAND gate 21 has as its input the output of predecoders 14, 16 and 18, namely, row select signals RS4 through RS7, RS8 through RS11 and RS12 through RS15. Thus, there are 64 NAND gates and decoding circuits in the present invention. The output of NAND gate 21 is coupled to the input of inverter 22. The output of inverter 22, as well as the output of NAND gate 21 are coupled to the low voltage to high voltage conversion stage. This stage consists of cross-coupled p-channel transistors 24 and 25. Each of these transistors is also coupled to VX. VX is set to VCC during read and bulk erase operations and to VPP during Program and Erase modes. VCC is approximately 5 volts in the preferred embodiment. VPP is a programming voltage level and in the preferred embodiment is approximately 12 volts. The drain of transistor 24 is coupled to n-channel transistor 26 while the drain of transistor 25 is coupled to n-channel transistor 27. The gate of transistor 26 is coupled to the output of inverter 22 while the gate of transistor 27 is coupled to the output of NAND gate 21. The junctions of transistors 24 and 26 on line 28 and transistors 25 and 27 on line 29 serve as the output of this stage.

The signals on line 28 and 29 are coupled to a pair of CMOS switches. One switch, coupled to line 28, consists of transistors 31 and 32. Line 29 is coupled to the second switch, which is comprised of transistors while transistors 32 and 34 are n-channel. The gates of transistors 32 and 33 are coupled to PERSH signal from multiplexor 19 of FIG. 1 while the gates of transistors 31 and 34 are coupled to the complement of that signal. Thus, when PERSH is high, the signal on line 28 is selected and when PERSH is low, the signal on line 29 is selected. The output of the switches are coupled to common node 36. The final stage of the decoding circuit of the present invention is also coupled to node 36 and is a post decoding stage. Node 36 is coupled through lines 37 through 40 to the post decoding circuits of four row lines. For purposes of example, the decoding circuit coupled to row lines 0 through 3 will be considered. The post decoding circuit of row 3 consists of a CMOS switch (consisting of p-channel transistor 41 with n-channel transistor 42) whose output is coupled to the sources of p-channel transistor 49 and n-channel transistor 50 at node 57. Row line 3 is also coupled to node 57. The gate of transistor 41 is coupled to the RS3 signal from predecoder 12 while the gate of transistor 42 is coupled to the $\overline{RS3}$ signal from predecoder 12 of FIG. 1. A p-channel pull-up transistor 49 is coupled to row 3 at node 57. This transistor is coupled to VX. An n-channel pull down transistor 50 is also coupled to node 57 and to ground. The gate of transistor 49 is coupled to the PDR3 signal from predecoder 12 while the gate of transistor 50 is coupled to the NDR3 signal of predecoder 12. The post decoder circuits for each of the remaining row lines, row 0 through row 2 are identical to that described in regard to row 3. Because each of the decoding circuits of the present invention are coupled to 4 row lines, there are 64 such decoding circuits in the memory array.

If row 3 of the decoding circuit shown in FIG. 2 is to be read, the following occurs. The appropriate combination of row select signals on the inputs to NAND gate 21 are high, causing the output of NAND gate 21 to be low and the output of inverter 22 to be high. Thus, the decoding circuit coupled to Row 3 is selected. For the other 63 decoding circuits, the output of NAND gate 21 will be high and the output of inverter 22 will be low. For the selected decoding circuit the high signal from inverter 22 turns transistor 26 on, pulling the signal on line 28 low. Transistor 27, whose gate is coupled to the low output of NAND gate 21, turns off so that the signal on line 29 is high. The low signal on line 28 is also coupled to the gate of transistor 25 turning it on so that signal VPP is conducted through the transistor to line 29. The high signal on line 29 is also coupled to the gate of transistor 24, turning it off so that VPP is not conducted through transistor 24 and line 28 remains low.

In the read mode, the PERSH signal, coupled to the gates of transistors 32 and 33, is low. $\overline{PERSH}$ signal is high and is coupled to the gates of transistors 31 and 34. As a result, the CMOS switch coupled to line 28 is not turned and the switch on line 29, is turned on. Thus the high signal of line 29 is passed to node 36.

Row select signals RS0 through RS2 are low, turning off the CMOS switch on those lines. Row select signal RS3 is high, since the row 3 is to be selected. Signal RS3, coupled to the gate of n-channel transistor 42, turns on that transistor. $\overline{RS3}$ is therefore low and, coupled to the gate of p-channel transistor 41, turns on that transistor. This allows the high signal from node 36 to travel on line 40 through to node 57. Signal PDR3 is high, and signal NDR3 is low, so that pull up transistor 49 is off, and pulldown transistor 50 is off. For each of the other row lines, the PDR and NDR signals are each high. This turns off the p-channel pull up transistors and turns on the n-channel pull down transistors, ensuring that the non-selected word lines are low.

In the program mode, one of the 64 decoding circuits is selected by high signals on the input lines to NAND gate 21. The outputs of NAND gate 21 and inverter 22 are passed through the low to high voltage converter so that the output on line 28 is a low signal and on line 29 is a high signal. PERSH signal is low so that the switch consisting of transistors 31 and 32 is off and the switch consisting of transistos 33 and 34 is on. In the program mode, $\overline{PERSH}$, coupled to the gate of transistor 34, is set to VPP. Node 36, coupled through the CMOS switch to line 29, is at the programing voltage VPP. The switches, pulldown transistors and pull up transistors of the unselected lines of the post decoders receive the same signals as during the read mode with the high signals at VPP. Since node 36 is at VPP, the signal passed to row 3 is a programming signal to set the state of the cells along that row.

In the erase mode, one of the 64 decode circuits is selected by high signals to the inputs of the NAND gate 21. For the selected decoding circuit, the low voltage to high voltage converter passes a low signal on line 28 and high signal on line 29 to the switches comprised of transistors 31 through 34. In the erase mode the PERSH signal is at VPP and the $\overline{PERSH}$ signal is low. As a result, in the selected decoding circuit, the switch comprised of transistors 31 and 32 is on, passing the low signal from line 28 to node 36. The remaining 63 decoding circuits have a high signal at node 36.

The switches on row lines 0 through 2 have a low row select signal inputted into the n-channel transistors. Thus the row select complements are at VPP turning these switches off during the erase mode. The switch on the selected row line, in this case row 3, has as a row select input 1-VPP to the n-channel transistor 42. The gate of transistor 41 has as input the row select complement signal (in this case is low) and this switch is turned on. The PDR3 signal is at VPP turning pull up transistor 49 off. The NDR3 signal is low turning pull down transistor 50 off as well and a low signal from node 36 is coupled to row line 3 and erases the signals stored in the cells on that row. For each of the other row lines, the PDR and NDR signals are each low. This turns on the p-channel pull up transistors, holding the non-selected word lines at VPP. The addition of these pull up p-channel transistors allows the erase mode to be implemented. As a result, the decoding circuit of the present invention is entirely compatible with E²PROM arrays.

In the bulk erase mode, one of the decoding circuits is selected while 63 are not. For those 63, the signal at node 36 is low. However, for all word lines, the CMOS switches are turned off with the row select signals set low and the row select complement signals set at VCC. The transistors of those switches, such as transistors 41 and 42, are not turned on and no signal is passed to the word lines through those switches. Both the PDR and NDR signals are set to VCC so that the p-channel pull up transistors such as 49 are turned off. The n-channel pull down transistors, such as transistor 50, are turned on, pulling the word lines low and erasing them.

The table of FIG. 3 illlustrates the signal levels in various modes for the preferred embodiment of the present invention. For example, in the program mode, one of the outputs of each of the predecoders such as predecoder 14 (RS4–RS7), predecoder 16 (RS8–RS11), and predecoder 18 (RS12–RS15), is high while the remaining three outputs of each predecoder are low. In this manner, one of the 64 NAND gates coupled to the pre-decoders receives a high input on each of each of its three input lines and produces a low output signal. Still referring to the program mode, signal PERSH is set low while $\overline{PERSH}$ is set to the programming voltage VPP (approximately 12 volts). VX is also set to the programming voltage. One of the row select lines is set to the programming voltage while three are set low and correspondingly, one of the complements of the row select signals is set low while three are set to the programming voltage. In this manner, one of the CMOS switches attached to the row lines will be turned on. Three of the NDR signals, coupled to the gates of the pulldown transistors attached to the row lines, are set to the programming voltage while the NDR signal coupled to the row line which is to be programmed is set low. Each of the PDR signals, coupled to the gates of the pullup transistors attached to the row lines are set to the programming voltage. One of the 64 common nodes is at the programming voltage and is coupled through a CMOS switch to the selected row line, while the remaining 63 common nodes are low. The net result is that the selected row line is at the programming voltage while the remaining 255 row lines are low.

Although the above circuit has been described with regard to a 64K memory, it can easily be seen that the present invention can be applied to larger memories such 128K, 256K, 512 K and 1 megabit memories as well. For example, the circuit can be modified into a two sided decoder with the number of post decoders increasing from 4 to 8. For the manufacture of a memory array, the pitch of the decoder circuit is laid out within the pitch of the memory cell, for example, less than 5 microns. In this manner the row decoders may be laid out with the row lines so that reduction advantages resulting from smaller cells may be obtained.

Thus, a unique decoding circuit which may be used with E²PROM integrated circuits has been described.

I claim:

1. A CMOS electrically erasable, read only memories (E²PROM) static decoding circuit comprising:
   a first decoding means for receiving first address signals and for providing a first signal when said first address signals are in a predetermined state;
   a conversion means coupled to said first decoding means for converting said first signal into second and third signals;
   a pair of first switches coupled to said conversion means and to a first node, said first switches for providing one of said second and third signals to said first node;
   a plurality of said switches coupled to said node and to a plurality of second nodes, said second switches for passing said selected signal of said first node to said second nodes, said second nodes each coupled to at least one memory cell;
   first and second transistors coupled to each of said second nodes, said first and second transistors providing fourth and fifth signals at said second nodes;
   whereby signals may be provided to selected of said memory cells.

2. The circuit as described by claim 1, wherein said first and second switches are comprised of CMOS switches.

3. The circuit as described by claim 1, wherein said first transistors comprise p-channel transistors coupled to a voltage source.

4. The circuit as desribed by claim 1, wherein said second transistors comprise n-channel transistors coupled to ground.

5. A CMOS electrically erasable, read only memories (E²PROM) static decoding circuit comprising:
   a first decoding means for receiving first address signals and for providing a first signal and a first signal complement when said first address signals are in a predetermined state;
   a conversion means coupled to said first decoding means for converting the potential of said first signal and said first signal complement, said conversion means providing a second and third signal;
   a pair of first switches coupled to receive said second and third signals respectively and to said first decoding means, said first switches providing one of said second and third signals to a first node when said first address signals are in a predetermined state;
   a plurality of second switches coupled to said first node and to said first decoding means, each of said second switches coupled through one of a plurality of second nodes to at least one memory cell, said second switches providing a current path between said first node and said second nodes when said first address signals are in a predetermined state;
   a pull up p-channel transistor coupled to each of said second nodes and to a voltage source, the gates of each of said pull up transistors coupled to said first decoding means, said pull up transistors coupling said second node to said voltage source when said first address signals are in a predetermined state;

an n-channel pull down transistor coupled to each of said second nodes and to ground, the gate of said pull down transistor coupled to said first decoding means, said pull down transistor coupling said second node to ground when said first address signals are in a predetermined state;

whereby one of said memory cells may be selected.

6. The circuit as described by claim 5 wherein said first and second switches comprise CMOS switches.

7. The circuit as described by claim 5 wherein said first decoding means comprises a plurality of buffers and predecoders.

8. The circuit as described by claim 5 wherein said conversion means comprises a pair of cross-coupled p-channel transistors each coupled to an n-channel transistor.

9. The circuit as described by claim 5 wherein said voltage source is sufficient to program said memory cells.

* * * * *